US007450399B2

(12) United States Patent
Sasachika

(10) Patent No.: US 7,450,399 B2
(45) Date of Patent: Nov. 11, 2008

(54) SIGNAL COUPLING APPARATUS AND TRANSMITTER INCLUDING SIGNAL COUPLING APPARATUS

(75) Inventor: Hideki Sasachika, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/889,866

(22) Filed: Aug. 17, 2007

(65) Prior Publication Data

US 2008/0063111 A1 Mar. 13, 2008

(30) Foreign Application Priority Data

Sep. 7, 2006 (JP) ............................ 2006-243110

(51) Int. Cl.
*H05K 7/02* (2006.01)
*H05K 7/04* (2006.01)

(52) U.S. Cl. ........................ 361/807; 361/760; 361/810

(58) Field of Classification Search ................. 361/807, 361/810, 720, 760, 748, 736, 794, 799
See application file for complete search history.

(56) References Cited

U.S. PATENT DOCUMENTS 5,604,972 A * 2/1997 McCarrick ................... 29/600
6,653,557 B2 * 11/2003 Wolf et al. .................. 174/386
7,301,755 B2 * 11/2007 Rodriguez et al. .......... 361/676
2005/0094357 A1 * 5/2005 Ewing et al. ................ 361/626

FOREIGN PATENT DOCUMENTS

JP 2002-290101 10/2002

* cited by examiner

*Primary Examiner*—Hung S Bui
(74) *Attorney, Agent, or Firm*—Finnegan, Henderson, Farabow, Garrett & Dunner, L.L.P.

(57) ABSTRACT

A signal coupling apparatus includes a coaxial type signal coupling element and a structure for fixing the element at a predetermined position on a circuit board. The structure includes a supporting member having a conductive cover part, longitudinal direction facing parts integrated with the cover part, and grounding parts integrated with both lateral sides of the cover part. The cover part is fitted on an external conductor of the element, and the grounding parts are in contact with grounding patterns on the board when the element is disposed at the predetermined position. Fixing elements fix the grounding parts to the board. The facing parts prevent an insulator surrounded by the external conductor from thermally expanding in the longitudinal direction of a central conductor surrounded by the insulator in the element while the element operates. A transmitter includes the above described circuit board and signal coupling apparatus.

12 Claims, 4 Drawing Sheets

SIGNAL COUPLING APPARATUS AND TRANSMITTER INCLUDING SIGNAL COUPLING APPARATUS

CROSS-REFERENCE TO RELATED APPLICATIONS

This application is based upon and claims the benefit of priority from prior Japanese Patent Application No. 2006-243110, filed Sep. 7, 2006, the entire contents of which are incorporated herein by reference.

BACKGROUND OF THE INVENTION

1. Field of the Invention

This invention relates to a signal coupling apparatus and a transmitter including a signal coupling apparatus.

2. Description of the Related Art

For example, in a transmitter transmitting high-frequency signals such as a transmitter used in a television broadcasting system, a signal coupling apparatus such as a 3 dB coupler line is used for coupling a plurality of high-frequency signals to amplify them.

JP-A-2002-290101 (KOKAI) discloses a tri-plate type signal coupling apparatus. In the tri-plate type signal coupling apparatus, plates (three dielectric plates and a ground plate) used herein must be brought in close contact with one another. However, the mutual closely contact of these plates in the tri-plate type signal coupling apparatus is easy to loosen. As a result, the tri-plate type signal coupling apparatus can not assure sufficient grounding, so that it is difficult to obtain stable and precise high-frequency characteristic.

As another signal coupling apparatus, a coaxial type signal coupling apparatus is also known. The coaxial type signal coupling apparatus is provided with a coaxial type signal coupling element which includes a slender central electrical conductor having both end parts for providing input and output terminals and an intermediate part between the both end parts, an electrical insulator surrounding the intermediate part of the central conductor concentrically, and an external electrical conductor surrounding an outer peripheral surface of the insulator. The insulator is made of heat-resistant synthetic resin such as polyimide, PTFE (polytetrafluoroethylene), and the like.

After the coaxial type signal coupling element is disposed at a predetermined position on a circuit board, both end parts and a central part of the external conductor in a longitudinal direction of the central conductor are soldered to ground patterns on the circuit board, and the input and output terminals at the both end parts of the central conductor are soldered to predetermined input/output connection patterns on the circuit board.

The coaxial type signal coupling apparatus is further provided with a structure for fixing the coaxial type signal coupling element at the predetermined position on the circuit board securely after the coaxial type signal coupling element is disposed at the predetermined position on the circuit board and electrical connection of the signal coupling element to predetermined circuits on the circuit board is terminated as described above.

This fixing structure includes band members and fixing elements. The band members are made of high heat-conductive material such as copper or aluminum, and these are put on the both end parts and the central part on the outer peripheral surface of the external conductor while the coaxial type signal coupling element is disposed at the predetermined position on the circuit board. The fixing elements, for example screws, are made of high heat-conductive material such as metal and fix both end parts of each band member to the circuit board. Distal end parts of the fixing elements penetrate the circuit board and are connected to a chassis supporting the circuit board and made of high heat-conductive material such as metal.

The band members and the fixing elements fix the coaxial type signal coupling element at the predetermined position on the circuit board securely, and transfer heat generated by the coaxial type signal coupling element while it operates to the chassis made of high heat-conductive material to radiate heat from the chassis.

The thermal expansion of the heat-resistant synthetic resin for the insulator is small, but it is not zero. Accordingly, the insulator expands slightly due to heat generated by the coaxial type signal coupling element while it operates. The thermal expansion of the insulator becomes the maximum in a direction along the longitudinal direction of the central conductor because the insulator has the largest size in the above described direction.

The both end parts of the insulator expanded maximum in the longitudinal direction projects outwardly from the both end parts of the external conductor having heat conductance superior to that of the insulator and having thermal expansion smaller than that of the insulator.

When the operation of the coaxial type signal coupling element is stopped and heat generation by the signal coupling element is also stopped, the insulator contracts. At this time, when both end parts of the outer peripheral surface of the insulator are caught by roughly worked portions on inner peripheral edges of end surfaces of the both end parts of the external conductor being in contact with the both end parts of the outer peripheral surfaces of the insulator, the both end parts of the insulator can not return to their initial positions.

As a result, the both end parts of the insulator cause stresses at the soldered portions on the both end parts of the outer peripheral surface of the external conductor. Such stresses occur at the soldered portions each time when the coaxial type signal coupling element stops its operation, so that durability of the soldered portions is lowered. When cracks or fractures occur at the soldered portions, desired grounding of the coaxial type signal coupling element can not be achieved sufficiently so that performance (namely, stable precise high-frequency characteristic) of the coaxial type signal coupling element lowers.

BRIEF SUMMARY OF THE INVENTION

According to one aspect of the present invention, a signal coupling apparatus comprises: a signal coupling element which couples inputted signals and which outputs coupled signal; and a fixing structure which fixes the signal coupling element at a predetermined position on a circuit board including a signal input/output circuit in and from which a predetermined signal is inputted and outputted and signal input/output patterns and grounding patterns for the signal input/output circuit, while the signal coupling element is electrically connected to the signal input/output patterns and grounding patterns. The signal coupling element comprises: a slender central electrical conductor which has both end parts providing input and output terminals electrically connected to the signal input/output patterns on the circuit board and an intermediate part between the both end parts; an insulator surrounding the intermediate part of the central conductor concentrically; and an external electrical conductor surrounding an outer peripheral surface of the insulator. The signal coupling element couples signals inputted from the input terminals and outputs the coupled signal from the output terminal. The fixing structure comprises: a supporting member which includes an electrically conductive cover part, longitudinal direction facing parts provided integrally with the cover part, and electrically conductive grounding parts provided integrally with both sides of the cover part in a radial direction of the central conductor; and fixing elements which fix the grounding parts of the supporting member to the circuit board. The cover part is in contact with an outer peripheral surface of the external conductor of the signal coupling element and extends over a length of the outer peripheral surface in a longitudinal direction of the central conductor. Each facing part faces at least one portion of a peripheral edge of each end surface of the insulator of the signal coupling element in the longitudinal direction of the central conductor. And, each grounding part extends in the longitudinal direction of the central conductor and is in contact with each grounding pattern on the circuit board when the signal coupling element is disposed at the predetermined position on the circuit board. The facing parts prevent the insulator from thermally expanding in the longitudinal direction of the central conductor while the signal coupling element operates.

According to one aspect of the present invention, a transmitter which generates, amplifies, and outputs a desired signal, comprises: a circuit board which includes a signal input/output circuit in and from which a desired signal is inputted and outputted and signal input/output patterns and grounding patterns for the signal input/output circuit; a signal coupling element which is disposed at a predetermined position on the circuit board, which is electrically connected to the signal input/output patterns and grounding patterns, and which couples inputted signals and outputs the coupled signal; and a fixing structure which fixes the signal coupling element to the predetermined position on the circuit board, while the signal coupling element is disposed at the predetermined position on the circuit board and is electrically connected to the signal input/output patterns and grounding patterns. The signal coupling element comprises: a slender central electrical conductor which has both end parts providing input and output terminals electrically connected to the signal input/output patterns on the circuit board and an intermediate part between the both end parts; an insulator surrounding the intermediate part of the central conductor concentrically; and an external electrical conductor surrounding an outer peripheral surface of the insulator. The signal coupling element couples signals inputted from the input terminals and outputs the coupled signal from the output terminal. The fixing structure comprises: a supporting member which includes an electrically conductive cover part, longitudinal direction facing parts provided integrally with the cover part, and electrically conductive grounding parts provided integrally with both sides of the cover part in a radial direction of the central conductor; and fixing elements which fix the grounding parts of the supporting member to the circuit board. The cover part is in contact with an outer peripheral surface of the external conductor of the signal coupling element and extends over a length of the outer peripheral surface in a longitudinal direction of the central conductor. Each facing part faces at least one portion of a peripheral edge of each end surface of the insulator of the signal coupling element in the longitudinal direction of the central conductor. And, each grounding part extends in the longitudinal direction of the central conductor and is in contact with each grounding pattern on the circuit board when the signal coupling element is disposed at the predetermined position on the circuit board. The facing parts prevent the insulator from thermally expanding in the longitudinal direction of the central conductor while the signal coupling element operates.

BRIEF DESCRIPTION OF THE SEVERAL VIEWS OF THE DRAWINGS

The accompanying drawings, which are incorporated in and constitute a part of the specification, illustrate a embodiment of the invention, and together with the general description given above and the detailed description of the embodiment given below, serve to explain the principles of the invention.

DETAILED DESCRIPTION OF THE INVENTION

Figure 1:
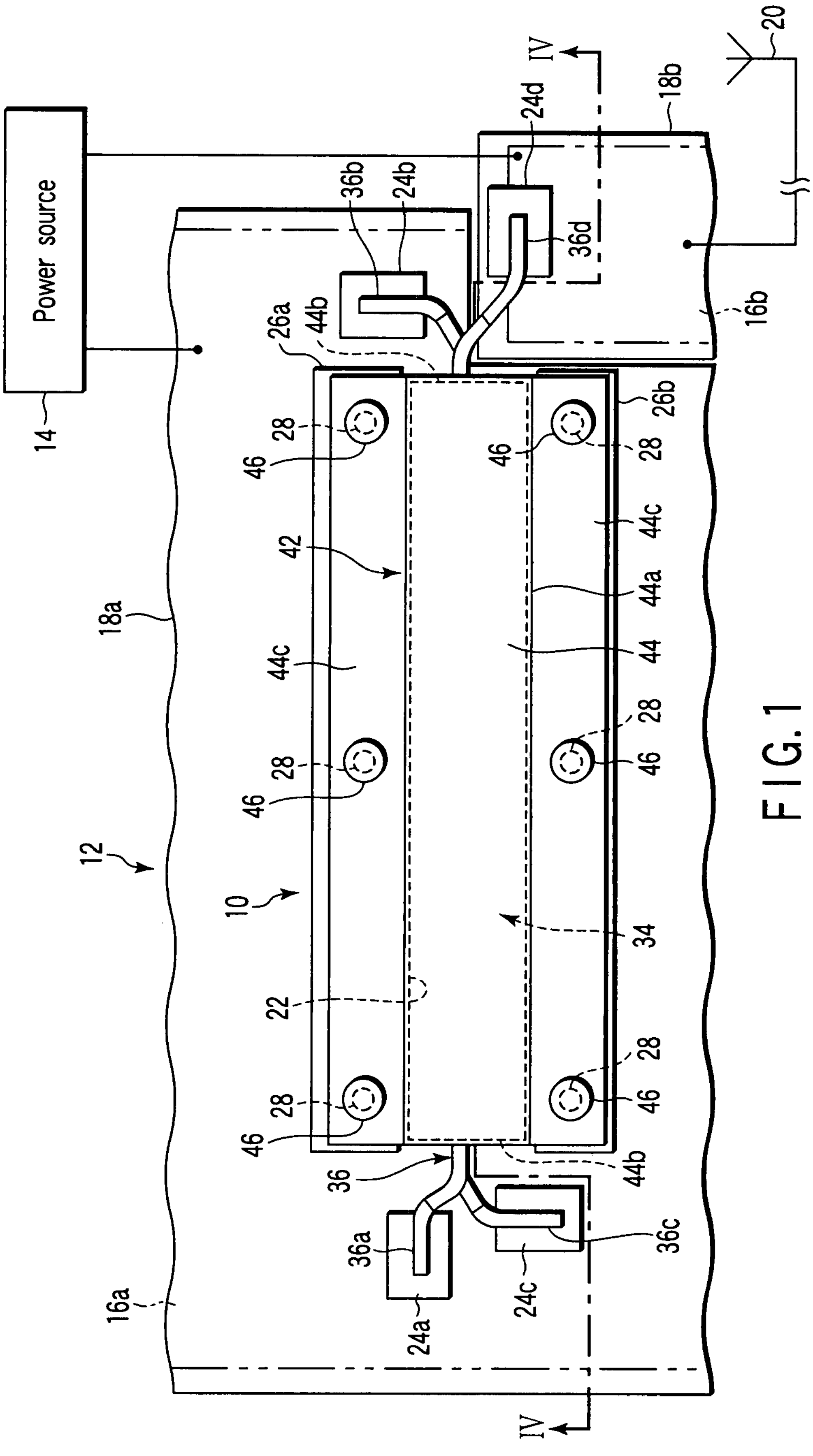
FIG. 1 is a plan view schematically showing a main section of a transmitter including a signal coupling apparatus according to an embodiment of the present invention.

As schematically shown in FIG. 1, a transmitter 12 for generating a desired signal, amplifying the signal, and outputting the same includes a signal coupling apparatus 10 according to an embodiment of the present invention, and first and second circuit board parts 18*a* and 18*b*.

The first circuit board part 18*a* includes a signal input circuit 16*a* on its one surface, and the signal input circuit 16*a* is connected to a power source 14. A desired signal is generated and inputted in the signal input circuit 16*a*. The second circuit board part 18*b* includes a signal output circuit 16*b* on its one surface, and the signal output circuit 16*b* outputs a desired signal. The signal output circuit 16*b* is connected with an antenna 20.

A slender opening 22 (shown in FIGS. 4-6 in detail) is formed at a predetermined position on the first circuit board part 18*a*. The signal input circuit 16*a* includes two signal input patterns 24*a* and 24*b* disposed near both ends of the opening 22 in its longitudinal direction, and further includes a dummy pattern 24*c* disposed near one end of the opening 22 in the longitudinal direction. The signal output circuit 16*b* includes a signal output pattern 24*d* disposed near the other end of the opening 22 in the longitudinal direction.

The signal input circuit 16*a* further includes two grounding patterns 26*a* and 26*b* disposed along two edges of the opening 22 extending in the longitudinal direction.

That is, in this embodiment, a combination of the signal input circuit 16*a* on the first circuit board part 18*a* and the signal output circuit 16*b* on the second circuit board part 18*b* configures a signal input/output circuit in and from which a desired signal is inputted and outputted. Further, in this embodiment, a combination of the two signal input patterns 24*a* and 24*b* and two grounding patterns 26*a* and 26*b* on the signal input circuit 16*a* and the signal output pattern 24*d* on the signal output circuit 16*b* configures signal input/output patterns and grounding patterns for the signal input/output circuit.

In this embodiment, through-holes 28 (shown in FIGS. 5 and 6 in detail) penetrating through the first circuit board part 18*a* are formed in each of the two grounding patterns 26*a* and 26*b* at plural positions spaced apart from one another in a longitudinal direction of each of the grounding patterns 26*a* and 26*b*. In this embodiment, three through-holes 28 are formed at both end parts and a central part between the both end parts on each of the two grounding patterns 26*a* and 26*b*.

A not shown grounding pattern is also provided on the other surface (back surface) of the first circuit board part 18*a*, and each of the two grounding patterns 26*a* and 26*b* provided on the one surface is connected to the other not shown grounding pattern on the back surface through not shown conductors provided on inner peripheral surfaces of the through-holes 28.

Figure 4:
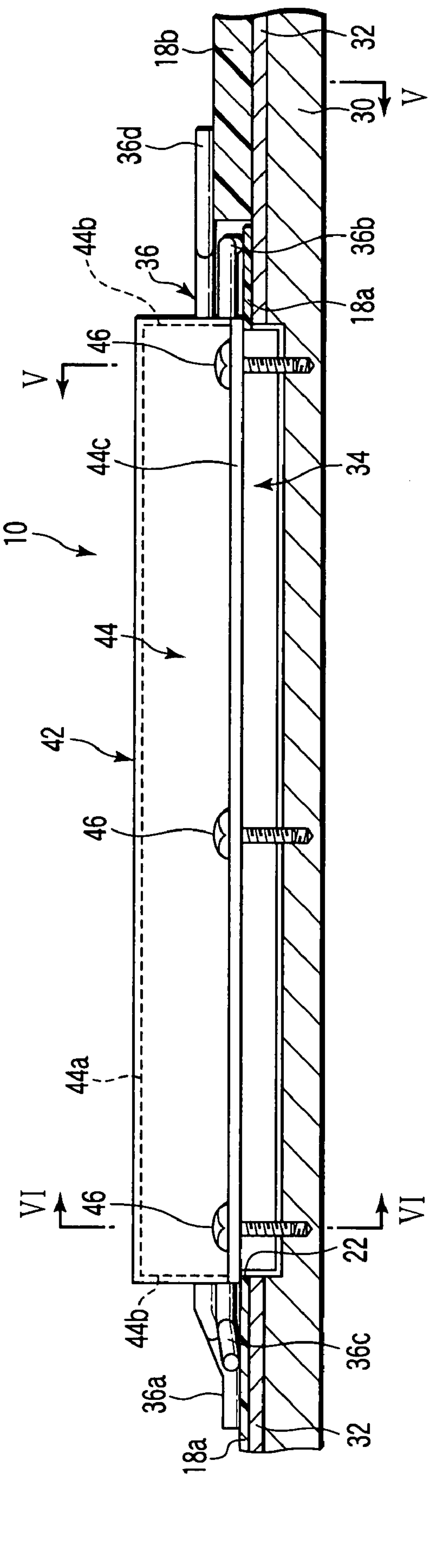
FIG. 4 is a schematic vertical sectional view taken along a line IV-IV in FIG. 1.
Figure 5:
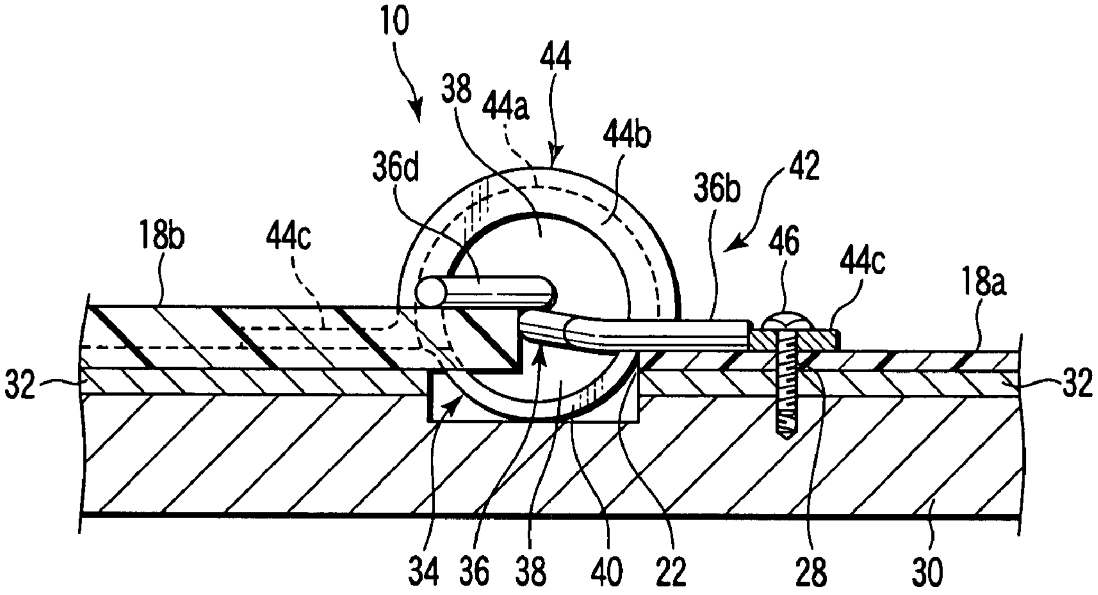
FIG. 5 is a schematic cross-sectional view taken along a line V-V in FIG. 4.
Figure 6:
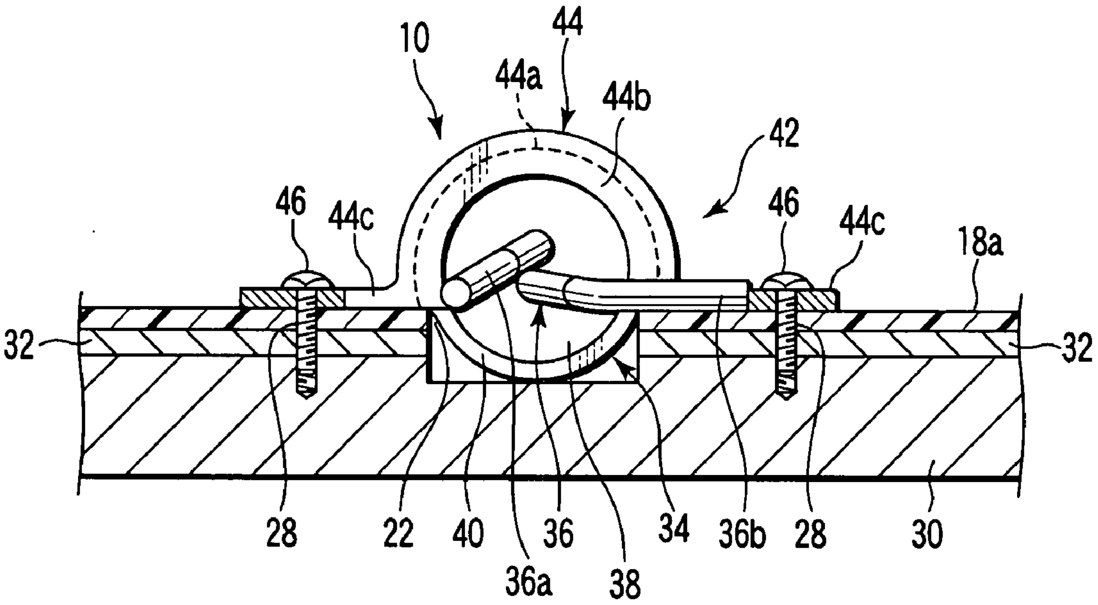
FIG. 6 is a schematic cross-sectional view taken along a line VI-VI in FIG. 4.

The back surface of the first circuit board part 18*a* opposed to its one surface on which the signal input circuit 16*a* is provided and a back surface of the second circuit board part 18*b* opposed to its one surface on which the signal output circuit 16*b* is provided are supported by an external supporting structure (chassis) 30 made of electrically conductive material (for example, iron, aluminum, or the like), as shown in FIGS. 4-6. The not shown grounding pattern on the other surface (back surface) of the first circuit board section 18*a* is electrically connected to the external supporting structure (chassis) 30 while the back surfaces of the first and second circuit board parts 18*a* and 18*b* are supported by the external supporting structure (chassis) 30. The external supporting structure (chassis) 30 further has good heat conductivity.

In this embodiment, spacers 32 for height adjustment are sandwiched between the first circuit board part 18*a* and the external supporting structure (chassis) 30 and between the second circuit board part 18*b* and the external supporting structure (chassis) 30, as shown in FIGS. 4-6. The spacers 32 are made of electrically conductive material (for example, iron, aluminum, or the like), and these have good heat conductivity. Accordingly, the spacer 32 achieves electrical connection and thermal connection between the not shown grounding pattern on the other surface (back surface) of the first circuit board part 18*a* and the external supporting structure (chassis) 30.

The spacer 32 does not cover the opening 22 at the predetermined position on the first circuit board part 18*a*, so that the opening 22 faces the external supporting structure (chassis) 30.

The transmitter 12 is further provided with a coaxial type signal coupling element 34 disposed in the slender opening 22 at the predetermined position on the first circuit board part 18*a*. In this embodiment, the signal coupling element 34 is electrically connected to the signal input patterns 24*a* and 24*b*, the dummy pattern 24*c*, and the grounding patterns 26*a* and 26*b* on the first circuit board part 18*a*, and the signal output pattern 24*d* on the second circuit board part 18*b*. The signal coupling element 34 couples signals inputted from the signal input patterns 24*a* and 24*b* and outputs the coupled signal to the signal output pattern 24*d*.

Figure 2:
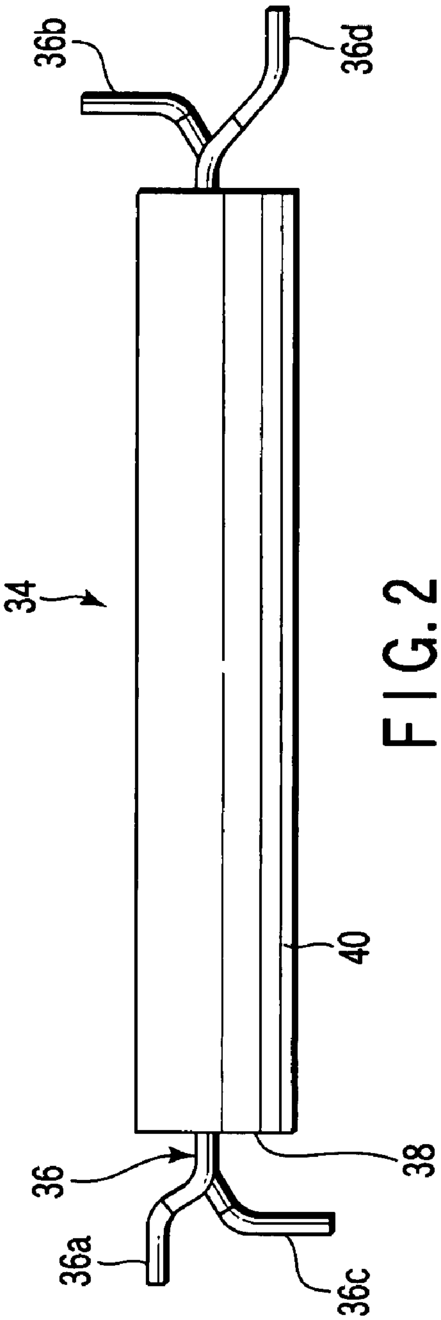
FIG. 2 is a plan view schematically showing a coaxial type signal coupling element used in the signal coupling apparatus according to the embodiment of the present invention.
Figure 3:
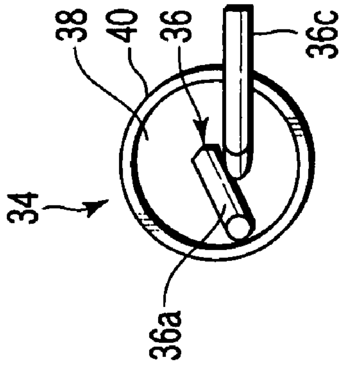
FIG. 3 is a schematic left side view of the signal coupling element shown in FIG. 2.

Specifically, as well shown in FIGS. 2 and 3, the signal coupling element 34 includes a slender central conductor 36 having both end parts and an intermediate part between the both end parts, an insulator 38 surrounding the intermediate part of the central conductor 36 concentrically, and an external conductor 40 surrounding an outer peripheral surface of the insulator 38. An outer peripheral surface of the external conductor 40 configures a circular surface having a predetermined diameter.

The insulator 38 is made of heat-resistant synthetic resin such as polyimide, PTFE (polytetrafluoroethylene), and the like.

The both end parts of the central conductor 36 provide a first input terminal 36*a* and a second input terminal 36*b*, and further provides a dummy terminal 36*c* and an output terminal 36*d*.

Such a coaxial type signal coupling element 34 is known and its internal structure is not described in detail.

Incidentally, in this embodiment, each of the first input terminal 36*a*, the second input terminal 36*b*, the dummy terminal 36*c*, and the output terminal 36*d* at the both end parts of the central conductor 36 has a length longer than a predetermined length.

The transmitter 12 is further provided with a fixing structure 42 for fixing the signal coupling element 34 at a predetermined position (that is, the opening 22 in the embodiment) on the first circuit board part 18*a*.

The fixing structure 42 is provided with a supporting member 44 including a cover part 44*a* of electrically conductive material (for example, copper, aluminum, and the like). The cover part 44*a* is configured to be in contact with an outer peripheral surface of the external conductor 40 of the signal coupling element 34, and extends over at least 50% of a length of the outer peripheral surface of the external conductor 40 in a direction along a longitudinal center line of the central conductor 36.

The supporting member 44 further includes longitudinal direction facing parts 44*b* provided integrally with the cover part 44*a*. Each of the longitudinal direction facing parts 44*b* faces at least one portion of a peripheral edge of each end surface of the insulator 38 of the signal coupling element 34 in the longitudinal direction of the central conductor 36.

The supporting member 44 further includes a pair of grounding parts 44*c* of electrically conductive material (for example, copper, aluminum, and the like) on both sides of the cover part 44*a* in a radial direction of the central conductor 38. The grounding parts 44*c* are integrated with the both sides of the cover part 44*a* and extend in a direction along the longitudinal direction center line of the central conductor 38.

Plural through-holes are formed in each of the grounding parts 44*c* at the same arrangement intervals as those of the plural through-holes 28 formed in each of the two grounding patterns 26*a* and 26*b* of the first circuit board part 18*a*.

In this embodiment, the cover part 44*a* of the supporting member 44 is configured to cover a predetermined area of the outer peripheral surface of the external conductor 40 of the signal coupling element 34 and to make in close contact with the predetermined area. For example, the predetermined area of the outer peripheral surface of the external conductor 40 is defined by almost a half of a length in a circumferential direction of the outer peripheral surface and a full length in a longitudinal direction of the outer peripheral surface, and the cover part 44*a* has an approximately semi-circular cross-section with the same radius as that of the predetermined area of the outer peripheral surface of the external conductor 40 of the signal coupling element 34.

Each longitudinal direction facing part 44*b* is configured by an inward flange-shaped part projecting inward from each of the both longitudinal ends of the cover part 44*a* in its radial direction.

The longitudinal direction facing parts 44*b* at the both longitudinal ends of the cover part 44*a* and the grounding parts 44*c* at the both radial sides of the cover portion 44*a* are formed integrally with the cover part 44*a* with the same material as that of the cover part 44*a*. And, the cover part 44*a*, longitudinal direction facing parts 44*b*, and grounding parts 44*c* of the supporting member 44 has good heat conductivity.

In this embodiment, when the predetermined area of the outer peripheral surface of the external conductor 40 of the signal coupling element 34 comes in close contact with the inner peripheral surface of the cover part 44*a* of the supporting member 44, the pair of grounding parts 44*c* of the supporting member 44, and the first and second input terminals 36*a* and 36*b*, the dummy terminal 36*c*, and the output terminal 36*d* at the both end parts of the central conductor 36 of the signal coupling element 34 are disposed to have a predetermined relative positional relationship.

In this state, plural sites adjacent to the pair of grounding parts 44*c* of the supporting member 44 in an area except for the predetermined area on the outer peripheral surface of the external conductor 40 of the signal coupling element 34 are fixed to the pair of grounding parts 44*c* by fixing means having electrical conductivity, for example, soldering. In the embodiment, the plural sites corresponds to both end parts and a central part between the both end parts on the outer peripheral surface of the external conductor 40 of the signal coupling element 34 in the longitudinal direction thereof.

The fixing means ensures electrical connection between the external conductor 40 of the signal coupling element 34 and the pair of grounding parts 44*c* of the supporting member 44 for a long term, and also assures the predetermined relative positional relationship described above for a long term.

The assembly of the supporting member 44 and the signal coupling element 34 after the cover part 44*a* of the supporting member 44 is in contact with and fixed to the signal coupling element 34 as described above, is fixed to the predetermined position of the first circuit board part 18*a* in the following manner.

First, the external conductor 40 of the signal coupling element 34 is positioned in the slender opening 22 at the predetermined position on the first circuit board part 18*a*, and the two grounding parts 44*c* of the supporting member 44 are placed on the two grounding patterns 26*a* and 26*b* on the both sides of the slender opening 22 in the first circuit board part 18*a*. In this state, the first and second input terminals 36*a* and 36*b*, the dummy terminal 36*c*, and the output terminal 36*d* at the both end parts of the central conductor 36 of the signal coupling element 34 are placed on and brought in line-contact with the signal input patterns 24*a*, 24*b* and dummy pattern 24*c* on the first circuit board part 18*a* and the signal output pattern 24*d* on the second circuit board pattern 18*b* over the length equal to or longer than the abovementioned predetermined length respectively.

These line contacts can be achieved owing to the abovementioned predetermined relative positional relationship among the pair of grounding parts 44*c* of the supporting member 44, the first and second input terminals 36*a* and 36*b*, the dummy terminal 36*c*, and the output terminal 36*d* at the both end parts of the central conductor 36 of the signal coupling element 34; and owing to a proper setting of a predetermined thickness of each of the spacers 32 interposed between the first and second circuit board parts 18*a* and 18*b* and the external supporting structure (chassis) 30.

Next, plural fixing elements 46, for example, fixing pins or fixing screws, are inserted into the through-holes (not shown) in the two grounding parts 44*c* and fixed to the through-holes 28 in the two grounding patterns 26*a* and 26*b* on the first circuit board part 18*a* corresponding to the through-holes (not shown) in the two grounding parts 44*c*.

These fixing elements 46 are preferably fixing screws having electrical conductivity, more preferably fixing screws having electrical conductivity and good heat conductivity, and distal end parts of these fixing elements 46 are fixed to the external supporting structure (chassis) 30 in this embodiment.

Such a plurality of fixing elements 46, together with the supporting member 44, provides the fixing structure 42 for fixing the signal coupling element 34 at the predetermined position on the first circuit board part 18*a*. That is, the fixing structure 42 includes the plurality of fixing elements 46 in addition to the supporting member 44.

The first and second input terminals 36*a* and 36*b*, the dummy terminal 36*c*, and the output terminal 36*d* at the both end parts of the central conductor 36 of the signal coupling element 34 are surely and electrically connected to the signal input patterns 24*a* and 24*b* and dummy pattern 24*c* on the first circuit board part 18*a* and the signal output pattern 24*d* on the second circuit board part 18*b* by known electrical connecting elements, for example, soldering.

Further, in this embodiment, a top end of an externally exposed area on the outer peripheral surface of the external conductor 40 of the signal coupling element 34, received in the opening 22 at the predetermined position on the first circuit board section 18*a*, is in line contact with a part of the surface of the external supporting structure (chassis) 30 exposed in the opening 22.

In the signal coupling element 34 fixed at the predetermined position on the first circuit board part 18*a* as described above, while the first and second input terminals 36*a* and 36*b*, dummy terminal 36*c*, and output terminal 36*d* at the both end parts of the central conductor 36 of the signal coupling element 34 are in line-contact with the signal input patterns 24*a* and 24*b* and dummy pattern 24*c* on the first circuit board part 18*a* and the signal output pattern 24*d* on the second circuit board part 18*b* respectively over the length longer than the predetermine length, these terminals are electrically connected to these patterns by known electrical connecting elements, for example, soldering. Therefore, these electrical connections are reliable and their strengths are high.

The external conductor 40 of the signal coupling element 34 is reliably, firmly and electrically connected (namely, grounded) to the two grounding patterns 26*a* and 26*b*, since the plural sites of the outer peripheral surface of the external conductor 40 are fixed to the pair of grounding parts 44*c* of the supporting member 44 by the fixing means having electrical conductivity and the grounding parts 44*c* are fixed to the two grounding patterns 26*a* and 26*b* on the first circuit board part 18*a* by the plural fixing elements 46 having electrical conductivity.

In this embodiment, the two grounding patterns 26*a* and 26*b* are finally, reliably, firmly, and electrically connected (namely, grounded) to the external supporting structure (chassis) 30 having electrical conductivity through the abovementioned grounding pattern (not shown) on the other surface (back surface) of the first circuit board part 18*a* electrically connected to the two grounding patterns 26*a* and 26*b* by the conductors (not shown) on the inner peripheral surfaces of the plurality of through-holes 28 formed in the grounding patterns 26*a* and 26*b* and through the spacers 32 having electrical conductivity.

Further, since the distal end parts of the plural fixing elements 46 having electrical conductivity are fixed to the external supporting structure (chassis) 30 having electrical conductivity and since the top end of the externally exposed area on the outer peripheral surface of the external conductor 40 of the signal coupling element 34 is in line contact with the part of the surface of the external supporting structure (chassis) 30 exposed in the opening 22, grounding of the external conductor 40 of the signal coupling element 34 is achieved further reliably and firmly.

While the predetermined signals are inputted from the signal input patterns 24*a* and 24*b* of the first circuit board part 18*a* into the first and second input terminals 36*a* and 36*b* at the both end parts of the central conductor 36 and are coupled with each other, and the coupled signal is outputted from the output terminal 36*d* to the signal output pattern 24*d* of the second circuit board part 18*d* (that is, during operation of the signal coupling element 34), the signal coupling element 34 generates heat.

This heat is radiated efficiently through the cover part 44*a* of the supporting member 44 having good heat conductivity and being in close contact with the outer peripheral surface of the external conductor 40 of the signal coupling element 34.

This heat is also transferred to the two grounding patterns 26*a* and 26*b* from the pair of grounding parts 44*c* of the supporting member 44 fixed to the external conductor 40 by the fixing means having heat conductivity. And, it is finally and reliably transferred to the external supporting structure (chassis) 30 having good heat conductivity through the above described conductors (not shown) on the inner peripheral surfaces of the through-holes 28 in the two grounding patterns 26*a* and 26*b*, the above described grounding pattern (not shown) on the other surface (back surface) on the first circuit board part 18*a*, and the spacer 32 having good heat conductivity.

In this embodiment, the above described heat is also transferred to the external supporting structure (chassis) 30 having good heat conductivity by the fixing elements 46 having good heat conductivity and fixing the grounding parts 44*c* of the supporting member 44 to the external supporting structure (chassis) 30, and the heat is also transferred to the external supporting structure (chassis) 30 through the top end of the externally exposed area on the outer peripheral surface of the external conductor 40 being in line contact with the part of the surface of the external supporting structure (chassis) 30 exposed in the opening 22.

Therefore, in this embodiment, the heat generated in the signal coupling element 34 is radiated reliably and efficiently.

The heat generated in the signal coupling element 34 acts to cause relatively large thermal expansion in the insulator 38 in the direction along the longitudinal center line of the central conductor 36. However, this thermal expansion is prevented because the peripheral edges of the both end surfaces of the insulator 38 in the direction along the longitudinal center line abut on the pair of longitudinal direction facing parts 44*b* of the supporting member 44.

Therefore, the both end surfaces of the insulator 38 are prevented from projecting externally from the both end surfaces of the external conductor 40 in the direction along the longitudinal center line while the signal coupling element 34 operates and generates heat.

As a result, repeated stress to lower grounding performance of the supporting member 44 between the external conductor 40 of the signal coupling element 34 and the two grounding patterns 26*a* and 26*b* on the first circuit board part 18*a* does not occur between them. This means that the heat generated by the operation of the signal coupling element 34 does not lower the performance of the signal coupling element 34.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal coupling apparatus comprising:

a signal coupling element which couples inputted signals and which outputs coupled signal; and a fixing structure which fixes the signal coupling element at a predetermined position on a circuit board including a signal input/output circuit in and from which a predetermined signal is inputted and outputted and signal input/output patterns and grounding patterns for the signal input/output circuit, while the signal coupling element is electrically connected to the signal input/output patterns and grounding patterns, the signal coupling element comprising a slender central electrical conductor which has both end parts providing input and output terminals electrically connected to the signal input/output patterns on the circuit board and an intermediate part between the both end parts, an insulator surrounding the intermediate part of the central conductor concentrically, and an external electrical conductor surrounding an outer peripheral surface of the insulator, and the signal coupling element coupling signals inputted from the input terminals and outputting the coupled signal from the output terminal, and the fixing structure comprising a supporting member which includes an electrically conductive cover part, longitudinal direction facing parts provided integrally with the cover part, and electrically conductive grounding parts provided integrally with both sides of the cover part in a radial direction of the central conductor, and fixing elements which fix the grounding parts of the supporting member to the circuit board, the cover part being in contact with an outer peripheral surface of the external conductor of the signal coupling element and extending over a length of the outer peripheral surface in a longitudinal direction of the central conductor, each facing part facing at least one portion of a peripheral edge of each end surface of the insulator of the signal coupling element in the longitudinal direction of the central conductor, and each grounding part extending in the longitudinal direction of the central conductor and being in contact with each grounding pattern on the circuit board when the signal coupling element is disposed at the predetermined position on the circuit board, and the facing parts preventing the insulator from thermally expanding in the longitudinal direction of the central conductor while the signal coupling element operates.

2. The signal coupling apparatus according to claim 1, wherein a part of the circuit board which is opposite to the signal input/output patterns and grounding patterns is supported by an electrically conductive external supporting structure, and the fixing elements are fixed to the external supporting structure.

3. The signal coupling apparatus according to claim 2, wherein the supporting member and fixing elements of the fixing structure, and the external supporting structure have good heat conductivity.

4. The signal coupling apparatus according to claim 2, wherein the circuit board includes an opening facing the external supporting structure at the predetermined position, the signal coupling element is received in the opening, and the external conductor of the signal coupling element in the opening is connected to the external supporting structure.

5. The signal coupling apparatus according to claim 4, wherein the supporting member and fixing elements of the fixing structure, and the external supporting structure have good heat conductivity.

6. The signal coupling apparatus according to claim 1, wherein the input and output terminals at the both end parts of the central conductor of the signal coupling element are configured to come in line contact with the signal input/output patterns on the circuit board over at least predetermined lengths when the signal coupling element is disposed at the predetermined position on the circuit board.

7. A transmitter which generates, amplifies, and outputs a desired signal, comprising:

a circuit board which includes a signal input/output circuit in and from which a desired signal is inputted and outputted and signal input/output patterns and grounding patterns for the signal input/output circuit;

a signal coupling element which is disposed at a predetermined position on the circuit board, which is electrically connected to the signal input/output patterns and grounding patterns, and which couples inputted signals and outputs the coupled signal; and a fixing structure which fixes the signal coupling element to the predetermined position on the circuit board, while the signal coupling element is disposed at the predetermined position on the circuit board and is electrically connected to the signal input/output patterns and grounding patterns, the signal coupling element comprising a slender central electrical conductor which has both end parts providing input and output terminals electrically connected to the signal input/output patterns on the circuit board and an intermediate part between the both end parts, an insulator surrounding the intermediate part of the central conductor concentrically, and an external electrical conductor surrounding an outer peripheral surface of the insulator, and the signal coupling element coupling signals inputted from the input terminals and outputting the coupled signal from the output terminal, and the fixing structure comprising a supporting member which includes an electrically conductive cover part, longitudinal direction facing parts provided integrally with the cover part, and electrically conductive grounding parts provided integrally with both sides of the cover part in a radial direction of the central conductor, and fixing elements which fix the grounding parts of the supporting member to the circuit board, the cover part being in contact with an outer peripheral surface of the external conductor of the signal coupling element and extending over a length of the outer peripheral surface in a longitudinal direction of the central conductor, each facing part facing at least one portion of a peripheral edge of each end surface of the insulator of the signal coupling element in the longitudinal direction of the central conductor, and each grounding part extending in the longitudinal direction of the central conductor and being in contact with each grounding pattern on the circuit board when the signal coupling element is disposed at the predetermined position on the circuit board, and the facing parts preventing the insulator from thermally expanding in the longitudinal direction of the central conductor while the signal coupling element operates.

8. The transmitter according to claim 7, wherein a part of the circuit board which is opposite to the signal input/output patterns and grounding patterns is supported by an electrically conductive external supporting structure, and the fixing elements are fixed to the external supporting structure.

9. The transmitter according to claim 8, wherein the supporting member and fixing elements of the fixing structure, and the external supporting structure have good heat conductivity.

10. The transmitter according to claim 8, wherein the circuit board includes an opening facing the external supporting structure at the predetermined position, the signal coupling element is received in the opening, and the external conductor of the signal coupling element in the opening is connected to the external supporting structure.

11. The transmitter according to claim 10, wherein the supporting member and fixing elements of the fixing structure, and the external supporting structure have good heat conductivity.

12. The transmitter according to claim 7, wherein the input and output terminals at the both end parts of the central conductor of the signal coupling element are configured to come in line contact with the signal input/output patterns on the circuit board over at least predetermined lengths when the signal coupling element is disposed at the predetermined position on the circuit board.

* * * * *